United States Patent [19]

Smith

[11] Patent Number: 4,473,888

[45] Date of Patent: Sep. 25, 1984

[54] SAW MONOLITHIC CONVOLVER USING DISPERSIVE TRANSDUCERS

[75] Inventor: William R. Smith, Laguna Niguel, Calif.

[73] Assignee: The United States of America as represented by the Secretary of the Army, Washington, D.C.

[21] Appl. No.: 315,822

[22] Filed: Oct. 28, 1981

[51] Int. Cl.[3] ..................... G06G 7/195; H01L 41/08; H03H 9/30

[52] U.S. Cl. ................................ 364/821; 310/313 B; 310/313 R; 333/195

[58] Field of Search .................... 364/821; 310/313 R, 310/313 B; 333/196

[56] References Cited

U.S. PATENT DOCUMENTS

| | | | |
|---|---|---|---|
| 3,699,364 | 10/1972 | Gerard | 333/196 X |
| 3,753,166 | 8/1973 | Worley et al. | 333/196 |
| 3,946,342 | 3/1976 | Hartmann | 333/196 |
| 4,005,378 | 1/1977 | Slobodnik et al. | 333/196 |
| 4,007,433 | 2/1977 | Houkawa et al. | 333/196 |
| 4,181,904 | 1/1980 | Weller et al. | 364/821 X |
| 4,205,280 | 5/1980 | Gilchrist et al. | 333/196 X |
| 4,428,062 | 1/1984 | Michaels | 364/821 |

OTHER PUBLICATIONS

Potter et al: Surface Acoustic Wave Slanted Device Technology, IEEE Transactions on Sonics and Ultrasonics, vol. SU-26, No. 6, Nov. 1979, 411/418 in 364/821.

Becker et al: Wideband $LiNbO_3$ Elastic Convolver with Parabolic Harus, 1979, Ultrasonics Symposium, Ref. in 369-821.

"Synthesis Procedure for Unapodized Nondispersive Surface Wave Filters" by W. R. Smith, pp. 117-119 of 1973, IEEE G-MTT International Microwave Symposium Digest of Technical Papers.

"Design of Unapodized Surface-Wave Transducers with Spectral Weighting" by Nudd et al, pp. 25-31 of 'Transactions on Microwave Theory and Techniques', vol. MTT-22, No. 1, 1/74.

"Acoustic Signal Processing Devices" by W. R. Smith of Technical Report ECOM-0175-1, Semi-Annual Report.

*Primary Examiner*—Felix D. Gruber

*Attorney, Agent, or Firm*—Anthony T. Lane; Jeremiah G. Murray; John W. Redman

[57] ABSTRACT

Disclosed is an improved SAW monolithic convolver using dispersive interdigital transducers designed by a novel technique that allows systematic compensation of phase errors arising in other parts of the convolver. The invention involves a small change in the positional relationship among the electrodes in the input transducers. This change is calculated to be just sufficient to cause a phase error exactly equal to, but of opposite sign to, the aforementioned phase errors.

9 Claims, 4 Drawing Figures

SAW MONOLITHIC CONVOLVER USING DISPERSIVE TRANSDUCERS

GOVERNMENT LICENSE

The Government has rights in this invention pursuant to Contract No. DAAB07-78-C-3004 awarded by the Department of the Army.

BACKGROUND OF THE INVENTION

This invention is directed to a Surface Acoustic Wave (SAW) device, more particularly to a signal processing device called a convolver. A convolver has an inputs a signal, designated as S and a reference signal designated as R and an output which is the convolution of these two inputs.

The prior art convolvers achieved broad bandwidth by using a periodic transducer (equally spaced electrodes) and limiting the number of electrodes to five or fewer. A matching circuit containing inductors and capacitors was also required in order to achieve 3dB fractional bandwidths approaching 40 percent. Transducers of this type did not allow the flexibility to compensate for amplitude and phase distortions occurring in other parts of the convolver, a feature of the present invention.

DETAILED DESCRIPTION OF THE DRAWINGS

Figure 1:
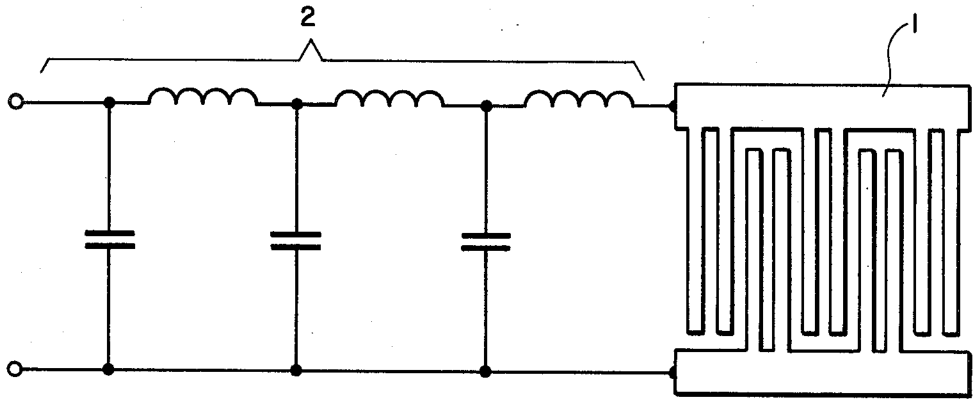
FIG. 1 (Prior Art)
FIG. 1 is a schematic representation of the acoustic wave launcher used in a prior art convolver.

FIG. 1 shows a periodic transducer 1 with inductor-capacitor matching network 2 as used in the prior art. All electrodes are equally spaced, and the available bandwidth is inversely proportional to the number of electrodes. The multi-element matching network 2 is needed in order to realize the available bandwidth because the transducer impedance is highly reactive.

Figure 2:
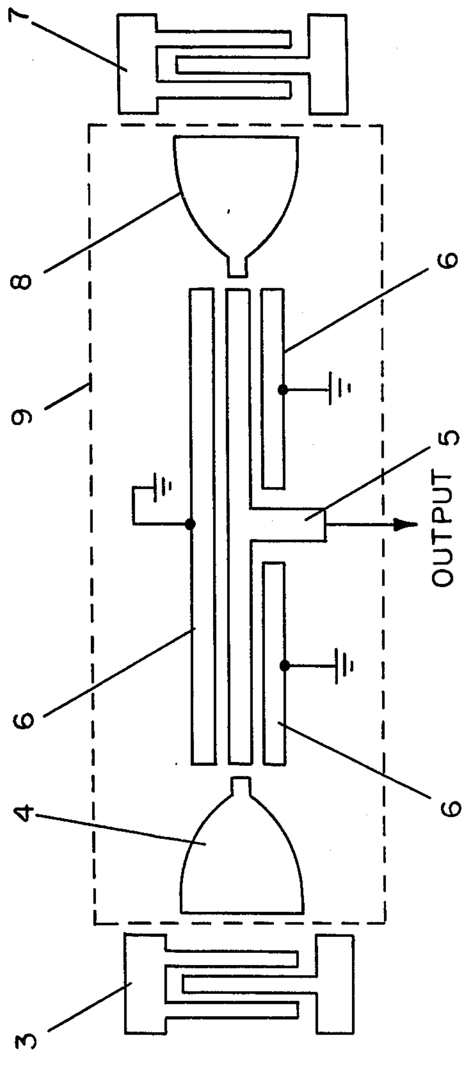
Figure 2 (Prior Art)
FIG. 2 is a schematic diagram of a prior art convolver.

FIG. 2 is a schematic diagram of a prior art surface acoustic wave monolithic convolver consisting of periodic transducers 3 and 7 and convolver components 9. Signal input transducer 3 launches a signal S'(t) from left to right through dispersive beam compressor 4 and onto the output dispersive waveguide electrode 5. Other dispersive waveguide electrodes 6 establish ground for the signal. The periodic reference signal transducer 7 launches a signal R'(t) from right to left through dispersive beam compressor 8 and onto the output dispersive waveguide 5. All components 3–8 may be fabricated from metallic thin films deposited on a lithium niobate substrate, not shown. The two input signals S and R are converted to surface acoustic waves (SAW) by the two interdigital transducers 3 and 7. The two SAW are then compressed by the parabolic horn compressors 4 and 8 or alternatively by multi-strip couplers, not shown. The SAW's then propagate under the output electrode 5 where elastic and piezoelectric nonlinearities of the substrate material (for example, lithium niobate) and the charge integrating effect of the electrode cause the convolution signal $$\int S'(\tau)R'(2t-\tau-T)d\tau \qquad (1)$$

to be formed.

The invention hereafter described consists of using specially designed, broadband, dispersive interdigital transducers (instead of ordinary periodic transducers) to launch the surface acoustic waves. Using transducers of the instant invention in this way offers the following advantages that were not possible with prior art SAW convolvers.

(1) Large 3-dB fractional bandwidths (up to approximately one octave or 67%) can be achieved, as contrasted with about 40% in the prior art.

(2) The double electrodes of this invention allow third harmonic operation, which means that the line sizes of the electrodes are increased by 50%, making fabrication easier.

(3) The transfer function (insertion loss versus frequency) of the transducers can be designed to exhibit a prescribed shape. This is useful in a convolver because the transducers can be designed to compensate for frequency-dependent propagation loss in the output electrode or to apply any desired spectral weighting on the input signals.

(4) The dispersive transducers can handle larger input power levels than can the periodic transducers of the prior art.

(5) The most significant single advantage of the dispersive transducers of this invention is that they can be designed to compensate for phase errors in other parts of the monolithic convolver. The most notable source of these phase errors is in the dispersive acoustic propagation in the region of the convolver output electrode, and this phase error is widely believed to be one of the most serious obstacles to achieving broad (<100 MHz) convolver bandwidth. The appropriate design procedure has been developed and verified by simulation as described below and shown in FIG. 4. To be noted is the fact that it does not sacrifice the amplitude control of (3) above, so that independent amplitude and phase compensation are now available.

Figure 3:
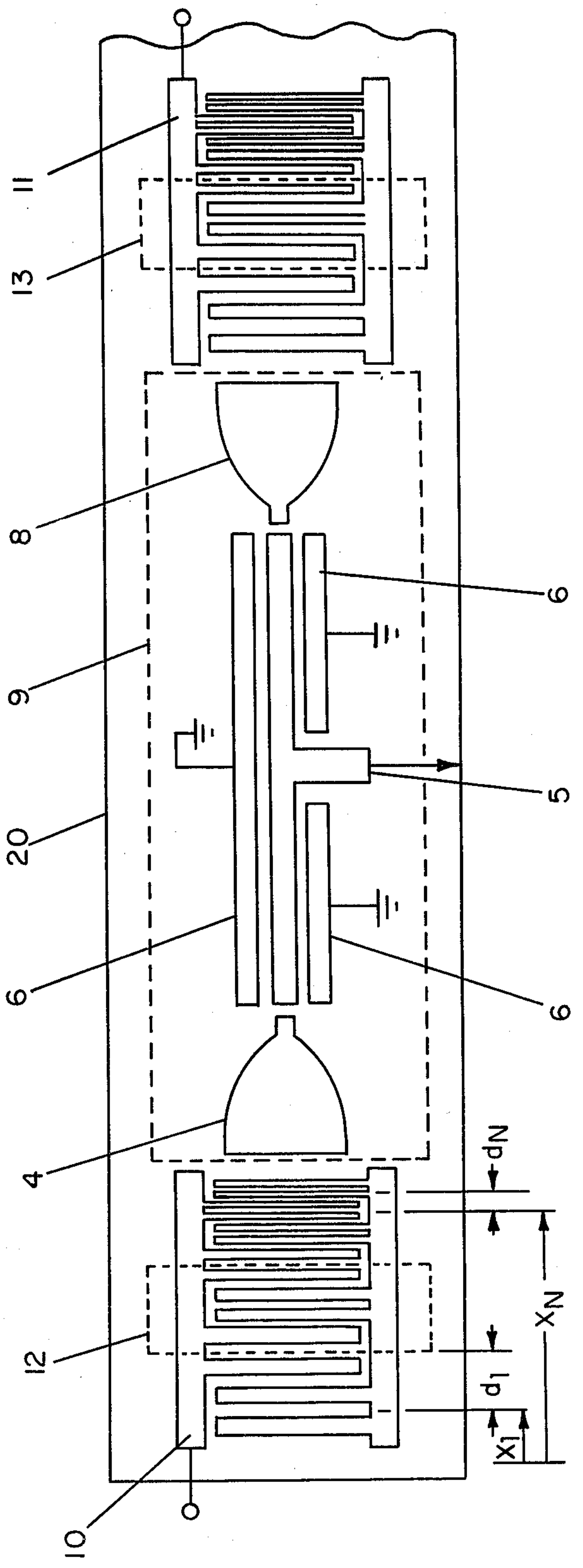
FIG. 3 illustrates the acoustic wave launchers (transducers) used in the instant invention.

The technique for introducing broadband signals into a convolver with control of the amplitude transfer function utilizes the geometry shown in FIG. 3. Both transducers are individually dispersive because the electrode spacing "d" varies monotonically from a maximum value "$d_1$" at one end to a minimum value "$d_N$" at the other end. Note that electrode positions are $x_i$ and electrode spacings are $d_i$, where i is any integer in the range 1 to N, and N is the total number of electrodes in the transducer. It is easy to achieve broadband operation since the lowest passband frequency is $f_1=(V_{SAW}/2d_1)$ and the highest passband frequency is $f_N=(V_{SAW}/2d_N)$. The "monolithic convolver components" 9 are effectively inserted between the two transducers of a delay line that is nondispersive because the two transducers are identical and separated by a translation without inversion.

The use of identical dispersive transducers in the configuration of FIG. 3 does not distort the convolver output response, even though both signals are dispersed in the SAW-launching process. In FIG. 3, consider left-hand transducer 10 to be a filter having an impulse response h(t) that launches SAW into the convolver components 9. Then the right-hand transducer 11, which launches a SAW in the opposite direction, acts as a filter with impulse response $h(-t)$. All components are deposited upon piezoelectric substrate 20. Now suppose a signal $S(t)$ is applied to the left-hand transducer and a reference signal $R(t)$ is applied to the right-hand transducer. Then the two signals delivered to the convolver components 9 are $$S'(t)=S(t)*h(t) \tag{2}$$

and $$R'(t)=R(t)*h(-t) \tag{3}$$

where * denotes ordinary convolution. The monolithic convolver performs the function of convolution with a twofold time compression and a delay T which operation is denoted by ★ ; thus the convolver output signal is $$S'(t) \bigstar R'(t)=\int S'(\tau)R'(2t-\tau-T)d\tau. \tag{1a}$$

It is straightforward to show that * and ★ commute and associate such that $$S'(t) \bigstar R'(t)=\{S(t) \bigstar R(t)\}*\{h(t) \bigstar h(-t)\}. \tag{4}$$

The first factor in brackets would be the convolver output if the signals were not acted upon by the dispersive transducers. The second factor in brackets is the auto-correlation function of the dispersive transducer which the inventor desires to be a good approximation to a delta-function. In practice, this auto-correlation function has a finite width (approximately the reciprocal of the transducer bandwidth) and a sidelobe structure. If the spectrum of $h(t)$ is rectangular-shaped, the auto-correlation function is a $(\sin x/x)$ function; if the spectrum is weighted, the auto-correlation function has lower sidelobes but a wider main lobe. A practical design has sufficient bandwidth that the auto-correlation function $h(t) \bigstar h(-t)$ is an excellent approximation to a delta-function in the sense that there is negligible difference between $S'(t) \bigstar R'(t)$ and $S(t) \bigstar R(t)$. In any event, the most important interpretation of Eq. (4) is that there is no distortion caused by the dispersive design of the identical transducers. However, the length of the convolver output electrode 5 must be increased by an amount equal to one transducer length, because the duration of $S'(t) \bigstar R'(t)$ exceeds the duration of $S(t) \bigstar R(t)$ by that amount.

Considering, then, the techniques of controlling the shape and quality of the convolver output: first, a flat response ($e(f)=1$) across a wide passband is often desired, or a more general ("weighted") shape for $e(f)$ might be desired to compensate for amplitude errors in other portions of the convolver. The amplitude transfer function design procedure, as mentioned earlier, consists of choosing a particular relation for the spacings of the electrodes. There need to be understood two concepts in the procedure: the number of active electrodes $N_a(f)$, and the electrode position function $g(t)$. The latter is needed for the dispersion (phase) correction described later. The identical dispersive transducers 10 and 11 of FIG. 3 may be assumed to be operating at a frequency f. Regions 12 and 13 (enclosed in dashed boxes), which contain electrodes spaced approximately $V_{SAW}/2f$, are the only regions of significant SAW transduction, and the remaining electrodes act only as a passive shunt capacitance. In relation with the electrodes of the transducers, a SAW of frequency "f" would synchronize with the electrodes in the dashed-box areas, where the propagation delay between successive electrodes is approximately $t=\frac{1}{2}f$. The SAW would remain "nominally" in synchronism with the electrodes over a temporal interval $\{t_-,t_+\}$. Here $t_-$ and $t_+$ are the temporal locations where the SAW incurs a 90 phase error with respect to the positions of the electrodes. The number of active electrodes $N(f)$ is counted as those that are in approximate synchronism with the SAW, i.e. those that lie in the temporal interval $\{t_-,t_+\}$. This number $N_a(f)$ in general depends on the operating frequency f and the associated location t. The transducer amplitude or spectral design problem is to choose the electrode positions so that $N_a(f)$ is large or small according as the desired transfer function $e(f)$ is large or small at each frequency.

A quantity that appears in the resultant design prescription is the electrode position function $g(t)$. The electrode positions are time-aligned with the maxima and minima of the function $\cos\{2\pi g(t)\}$. The electrode position function can be interpreted through the following three characteristics:

1. The electrode positions $t_n$ satisfy $$g(t_n)=n/2. \tag{5}$$

2. The transducer is an approximate matched filter to a waveform whose phase is $$\phi(t)=2\pi g(t). \tag{6}$$

3. The local synchronous frequency (i.e., the frequency of strongest transduction at the location t) is $$f(t)=g'(t). \tag{7}$$

The equation, then, that determines $g(t)$ is:

$$g''(t)=k\{g'(t)\}^3/e\{g'(t)\},\ 0<t<_F \tag{8}$$

with initial conditions $g(0)=0$, $g'(0)=f_1$, and with the solution beginning at $t=0$ and extending up to time $t_F$ such that $g(t_F)=f_N$. Thus, at frequencies $g'(t)$ where the desired response $e\{g'(t)\}$ is large, the rate of change, $g''(t)$, of the synchronous frequency is small, so that the number of active electrodes, $N\{g'(t)\}$, is large.

The total number of electrodes in the entire transducer depends on the total time extent, $t_F$, required for the instantaneous frequency to shift from the lowest desired passband frequency, $f_1$, to the highest desired passband frequency, $f_N$. When the constant k is small, the total number of electrodes is large, and vice-versa. Thus, given the desired bandwidth $(f_N-f_1)$ and the desired bandshape $e(f)$, the total number of electrodes remains a free variable controlled by the choice of the constant k. This allows independent control on the transducer capacitance (and hence impedance) even when the transducer aperture may be constrained by other aspects of the convolver design.

With understanding of the above amplitude design problem and its solution, it is then easy to state the appropriate transducer design perturbation for correcting an arbitrary convolver phase error.

The electrode position function $g(t)$ is related to the phase of the transducer impulse response, $\phi(t)$, by $$g(t)=\phi(t)/2\pi. \tag{6}$$

Also, throughout the transducer there is a one-to-one correspondence between temporal position t and the local instantaneous frequency f, via the relation $$f(t)=g'(t). \quad (7)$$

Suppose that there is a total phase error in the convolver (due to dispersive SAW propagation and matching circuit dispersion) given by $-\phi(f)$. To compensate for this error and make the two transducers act as a delay line whose dispersive phase component is $+\phi(f)$ one:

First, designs two identical transducers which satisfy the desired amplitude transfer function e(f), Second, calculates a perturbation to g(t) as follows:

(a) For transducers designed to operate at their fundamental frequency, take $$g(t) \rightarrow g\pm(t) = g(t) \pm \left(\frac{1}{4\pi}\right) \Delta\phi\{g'(t)\}, \quad (9a)$$

using the + sign for one transducer and the − sign for the other.

(b) For transducers designed for third harmonic operation, one would use $$g(t) \rightarrow g\pm(t) = g(t) \pm \left(\frac{1}{4\pi}\right)\left\{\frac{\Delta\phi[3g'(t)]}{3}\right\}. \quad (9b)$$

And, third, in each transducer, the positions of the electrodes are given by $$g\pm(tn) = n/2. \quad (10)$$

The transducers are now not quite identical and there is a residual dispersion $\Delta\phi(f)$. The perturbation for providing the dispersion has been split equally between the two transducers. Note that the residual dispersion $\Delta\phi(f)$ is in general much smaller than the total dispersion inherent in either transducer alone. Consequently, the perturbed electrode position functions result in only a small shift in the electrode positions and the change in the transducer amplitude transfer function is negligible.

Figure 4:
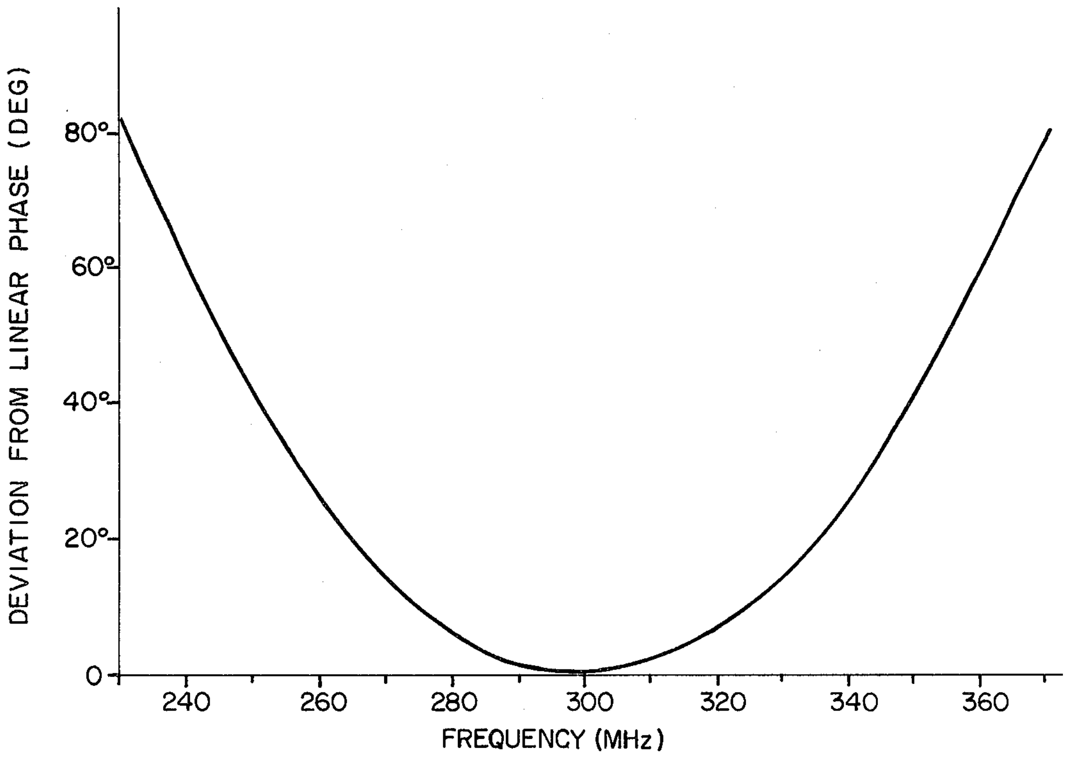
FIG. 4 is a graph of the phase-versus-frequency response.

FIG. 4 is illustrative of this procedure. Supposing a convolver structure which, when operated as a two-port delay line, has a dispersive phase error of:

$$-\Delta\phi(f) = -60^\circ\left[\frac{f-300\text{ MHz}}{60\text{ MHz}}\right]^2. \quad (11)$$

Then, after applying the above perturbation (9b) to a specific third harmonic transducer design having flat amplitude response over 120 MHz bandwidth, the composite phase response of the two transducers will be that shown in FIG. 4. This result is very close to the desired quadratic phase correction in the operating band 240-360 MHz. A similar result will be found for fundamental-frequency transducer design.

Having disclosed my invention I claim:

1. A monolithic surface acoustic wave (SAW) convolver comprising:

a piezoelectric substrate;

at least a pair of dispersive interdigitated electrode input transducers located on said substrate; and convolver components located on said substrate between said input transducers and including an output electrode.

2. A broad band SAW convolver as in claim 1 having upper and lower passband frequencys wherein the lower passband frequency of the device is substantially given by:

$$f_1=(V_{SAW}/2d_1)$$

and the upper passband frequency is substantially given by:

$$f_N=(V_{SAW}/2d_N)$$

where input transducer electrode spacing is $d_i$ and varies monotonically from a maximum value of $d_1$ at one end of said transducer to a minimum of $d_N$ at the other end, i being an integer from 1 to N, N being the total number of electrodes in each said input transducer.

3. The device of claim 2 wherein the number of said input transducers is two and said transducers are oriented in the same direction and are separated by a translation without inversion.

4. The device of claim 3 wherein said transducers have transfer functions $h(\pm t)$ the said transfer functions which are opposite and substantially equal, wherein the auto-correlation function of $h(t) \bigstar h(-t)$ closely approximates a delta function.

5. The device of claim 4 wherein said input transducers have a passband frequency spectrum e(f) which is controlled to provide a predetermined gain with respect to individual frequencies between said upper and lower passband frequencies.

6. The device of claim 4 wherein said input transducers have an electrode position function g(t) which is time-alligned with the maxima and minima of the function $\cos\{2\pi g(t)\}$.

7. The device of claim 6 wherein said input transducers have an electrode position function g(t) and an impulse response $\phi(t)$ which are related to each other by $g(t)=\phi(t)/2\pi$ and temporal position t and local instantaneous frequency f are related by $f(t)=[dg(t)/dt]$.

8. The device of claim 7 wherein said electrode position function g(t) is determined by $g''(t)=kg'(t)^3/eg'(t)$ with initial conditions $g(o)=o$, $g'(o)=f_1$ and with solution beginning at $t=o$ and extending to time $t_F$ such that $g(t_F)=f_N$.

9. The device of claim 8 wherein said input transducer electrode positions g(t) are defined by $$g(t)\cdot g\pm(t) = g(t) \pm \left(\frac{1}{4\pi}\right)\left\{\frac{\Delta\phi[mg(t)]}{m}\right\},$$

$g\pm(tn)=n/2$ where tn are the electrode positions in time in each transducer, and wherein $m=1$ for fundamental frequency, $m=3$ for 3rd harmonic operation, etc.

* * * * *